(12) United States Patent
Skulason et al.

(10) Patent No.: US 8,147,719 B2
(45) Date of Patent: Apr. 3, 2012

(54) CONDUCTIVE POLYMER COMPOSITIONS

(75) Inventors: Hjalti Skulason, Buellton, CA (US);
Mark T. Martello, Goleta, CA (US);
Che-Hsiung Hsu, Wilmington, DE (US)

(73) Assignee: E I du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 11/756,985

(22) Filed: Jun. 1, 2007

(65) Prior Publication Data

US 2008/0017834 A1  Jan. 24, 2008

Related U.S. Application Data

(60) Provisional application No. 60/809,934, filed on Jun. 1, 2006.

(51) Int. Cl.
*H01B 1/00* (2006.01)
*C08G 73/06* (2006.01)

(52) U.S. Cl. ........................... 252/500; 528/423
(58) Field of Classification Search .................. 528/423; 252/500

See application file for complete search history.

(56) References Cited

U.S. PATENT DOCUMENTS

| | | | |
|---|---|---|---|
| 3,282,875 A | 11/1966 | Connolly et al. | |
| 4,358,545 A | 11/1982 | Ezzell et al. | |
| 4,433,082 A | 2/1984 | Grot | |
| 4,940,525 A | 7/1990 | Ezzell et al. | |
| 5,463,005 A | 10/1995 | Desmarteau | |
| 5,876,604 A | 3/1999 | Nemser et al. | |
| 5,902,747 A | 5/1999 | Nemser et al. | |
| 6,150,426 A | 11/2000 | Curtin et al. | |
| 6,872,451 B2 | 3/2005 | Ebner et al. | |
| 6,921,482 B1 | 7/2005 | Cheng et al. | |
| 2003/0211331 A1 | 11/2003 | Louwet et al. | 428/419 |
| 2003/0215571 A1 | 11/2003 | Tahon et al. | 427/256 |
| 2004/0102577 A1 | 5/2004 | Hsu et al. | 525/182 |
| 2004/0127637 A1 | 7/2004 | Hsu et al. | 524/800 |
| 2005/0175861 A1 | 8/2005 | Elschner et al. | 428/690 |
| 2005/0205860 A1* | 9/2005 | Hsu et al. | 257/40 |
| 2006/0027791 A1 | 2/2006 | Tahon et al. | 252/500 |
| 2007/0025740 A1* | 2/2007 | Katoh et al. | 399/1 |

FOREIGN PATENT DOCUMENTS

| | | |
|---|---|---|
| EP | 1 647 566 A | 4/2006 |
| EP | 1647 566 A | 4/2006 |
| EP | 1 026 152 A1 | 7/2006 |
| WO | WO 98/31716 A1 | 7/1998 |
| WO | WO 99/52954 A1 | 10/1999 |
| WO | WO 03/006537 A1 | 1/2003 |

(Continued)

OTHER PUBLICATIONS

Lee et al., POLY9thieno[3,4-b]thiophene). A New Stable Low Band Gap Conducting Polymer, Macromolecules, 2001, vol. 34:5746-5747.

(Continued)

*Primary Examiner* — Mark Kopec
*Assistant Examiner* — Jaison Thomas

(57) ABSTRACT

Electrically conductive polymer compositions are provided. The compositions are dispersed in an aqueous liquid medium having an oxygen content less than 10% of the saturated level. The compositions can be an electrically conductive polymer doped with a fluorinated acid polymer, an electrically conductive polymer in admixture with a fluorinated acid polymer, or mixtures thereof. The conductive polymer composition has a conductivity that changes by less than 10% in 30 days.

14 Claims, 3 Drawing Sheets

FOREIGN PATENT DOCUMENTS

| WO | WO 03/048227 A | 6/2003 |
|---|---|---|
| WO | WO 03/048227 A | 6/2003 |
| WO | WO 2004/020444 A | 3/2004 |
| WO | WO 2004/020444 A | 3/2004 |

OTHER PUBLICATIONS

Sotzing et al., Poly(thieno[3,4-b]thiophene): A p- and n-Dopable Polythiophene Exhibiting High Optical Transparency in the Semiconducting State, Macromolecules, 2002, vol. 35:7281-7286.

A. Feiring et al., Aromatic Monomers With Pendant Fluoroalkylsulfonate and Sulfonimide Groups, Journal of Fluorine Chemistry, 2000, vol. 105:129-135.

A. Feiring et al., Novel Aromatic Polymers With Pendant Lithium Perfluoroalkylsulfonate or Sulfonimide Groups Macromoleculars, 2000, vol. 33:9262-9271.

D.D. Desmarteau, Novel Perfluorinated Ionomers and Ionenes, J. Fluorine Chem., 1995, vol. 72:203-208.

A.J. Appleby et al., Polymeric Perfluoro Bis-Sulfonimides as Possible Fuel Cell Electrolytes, J. Electrochem. Soc., 1993, vol. 140:109-111.

U.S. Appl. No. 60/105,662, filed Oct. 25, 1999, Zhen-Yu Yang et al.

U.S. Appl. No. 60/176,881, filed Jan. 9, 2000, Jose Manuel Rodriquez-Parada.

Written Opinion of the International Searching Authority, PCT/US2007/012992, PCT counterpart of the present application, Rafaël Kiebooms, Authorized Officer, Dec. 1, 2008.

F. Jonas et al; "Conductive Modifications of Polymers with Polypyrroles and Polythiophenes" Synthetic Metals, 41-43 (1991) 831-836.

B. K. Moss et al; "A Kinetic Study of Polypyrrole Degradation" Polymer, 1992 vol. 33, No. 9; 1902-1907.

M. Dietrich et al; "Electrochemical and Spectroscopic Characterization of Polyalkylenedioxythiophenes" Journal of Electroanalytical Chemistry, 369 (1994) 87-92.

T. L. Tansley et al; "Conductivity Degradation in Oxygen-Aged Polypyrrole" Journal of Applied Physics, 69 (11), (1991) 7711-7713.

X. B. Chen et al; "The Stability of Polypyrrole Electrical Conductivity" Eur. Polym J. vol. 30, No. 7 (1994) 809-811.

L. B. Groenendaal et al; "Poly(3,4-ethylenedioxythiophene) and Its Derivatives: Past, Present, and Future" Adv. Mater. (2000) 12, No. 7 481-494.

Webpage from CLEVIOS Conductive Polymers PEDT/PSS Date Unknown.

Webpage from CLEVIOS Conductive Polymers Technical Introduction Conductive Polymers Date Unknown.

\* cited by examiner

CONDUCTIVE POLYMER COMPOSITIONS

BACKGROUND INFORMATION

1. Field of the Disclosure

This disclosure relates in general to conductive polymer compositions and the method for making them.

2. Description of the Related Art

Conductive polymers have many uses, including applications in electronic devices. The conductive polymers are deposited to form electrically conductive or semiconductive layers which are used alone or in a combination of one or more electrodes, one or more electroactive components, one or more photoactive components, or one or more bioactive components. As used herein, the term "electroactive component", "photoactive component" or "bioactive component" refer to a component which exhibits the predetermined activity in response to a stimulus, such as an electromagnetic field, an electrical potential, solar energy radiation, a biostimulation field, or any combination thereof.

There is a continuing need for electrically conductive polymer compositions having improved physical and electrical properties.

SUMMARY

There is provided a composition comprising an electrically conductive polymer composition dispersed in an aqueous liquid medium having a dissolved oxygen content less than 10% of the saturated level, wherein the electrically conductive polymer composition is selected from the group consisting of an electrically conductive polymer doped with a fluorinated acid polymer, an electrically conductive polymer in admixture with a fluorinated acid polymer, and mixtures thereof. In one embodiment, the oxygen content is less than 0.5 ppm. In one embodiment the oxygen content is less than 0.1 ppm.

There is also provided a composition comprising a conductive polymer composition dispersed in an aqueous liquid medium, wherein the conductive polymer composition has a conductivity that changes by less than 10% in 30 days.

There is also provided a method for preparing a conductive polymer composition dispersed in an aqueous liquid medium, said process comprising the steps:

polymerizing a conductive monomer in the presence of a fluorinated acid polymer to form a doped conductive polymer;

removing oxygen dissolved in the aqueous medium.

In one embodiment of the above method, the oxygen is removed by passing the doped conductive polymer dispersion through a hollow fiber filter.

The foregoing general description and the following detailed description are exemplary and explanatory only and are not restrictive of the invention, as defined in the appended claims.

BRIEF DESCRIPTION OF THE DRAWINGS

Embodiments are illustrated in the accompanying figures to improve understanding of concepts as presented herein.

Figure 1:
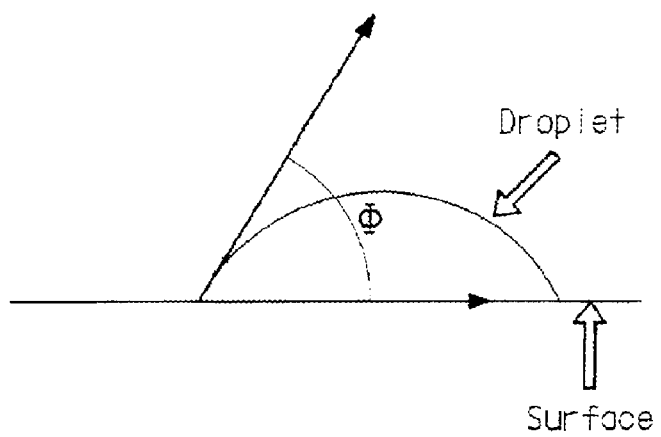
FIG. 1 is a diagram illustrating contact angle.

Skilled artisans appreciate that objects in the figures are illustrated for simplicity and clarity and have not necessarily been drawn to scale. For example, the dimensions of some of the objects in the figures may be exaggerated relative to other objects to help to improve understanding of embodiments.

DETAILED DESCRIPTION

Many aspects and embodiments have been described above and are merely exemplary and not limiting. After reading this specification, skilled artisans appreciate that other aspects and embodiments are possible without departing from the scope of the invention.

Other features and benefits of any one or more of the embodiments will be apparent from the following detailed description, and from the claims. The detailed description first addresses Definitions and Clarification of Terms followed by the Electrically Conductive Polymer, The Fluorinated Acid Polymer, Methods for Making the Conductive Polymer Compositions, Removal of Dissolved Oxygen, Organic Electronic Devices, and finally, Examples.

1. Definitions and Clarification of Terms

Before addressing details of embodiments described below, some terms are defined or clarified.

In some embodiments, the electrically conductive material is a polymer. The term "organic solvent wettable" refers to a material which, when formed into a film, is wettable by organic solvents. The term also includes polymeric acids which are not film-forming alone, but which form an electrically conductive polymer composition which is wettable. In one embodiment, organic solvent wettable materials form films which are wettable by phenylhexane with a contact angle no greater than 40°.

As used herein, the term "electrically conductive polymer" refers to any polymer or oligomer which is inherently or intrinsically capable of electrical conductivity without the addition of carbon black or conductive metal particles. The conductivity of a conductive polymer composition is measured as the lateral conductivity of films made from the composition, in S/cm.

The term "polymer" is intended to mean a material having at least one repeating monomeric unit. The term includes homopolymers having only one kind, or species, of monomeric unit, and copolymers having two or more different monomeric units, including copolymers formed from monomeric units of different species.

The term "electrical conductivity" includes conductive and semi-conductive. In one embodiment, films made from the doped electrically conductive polymer have a conductivity of at least $10^{-7}$ S/cm.

The term "doped" is intended to mean that the electrically conductive polymer has a polymeric counterion to balance the charge on the conductive polymer.

The term "fluorinated acid polymer" refers to a polymer having acidic groups, where at least some of the hydrogens have been replaced by fluorine. The term "acidic group" refers to a group capable of ionizing to donate a hydrogen ion to a Brønsted base.

The composition may comprise one or more different electrically conductive polymers and one or more different fluorinated acid polymers.

The term "in admixture with" is intended to mean that an electrically conductive polymer is physically mixed with a fluorinated acid polymer.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of "a" or "an" are employed to describe elements and components described herein. This is done merely for convenience and to give a general sense of the scope of the invention. This description should be read to include one or at least one and the singular also includes the plural unless it is obvious that it is meant otherwise.

Group numbers corresponding to columns within the Periodic Table of the elements use the "New Notation" convention as seen in the *CRC Handbook of Chemistry and Physics*, 81$^{st}$ Edition (2000-2001).

Unless otherwise defined, all technical and scientific terms used herein have the same meaning as commonly understood by one of ordinary skill in the art to which this invention belongs. Although methods and materials similar or equivalent to those described herein can be used in the practice or testing of embodiments of the present invention, suitable methods and materials are described below. All publications, patent applications, patents, and other references mentioned herein are incorporated by reference in their entirety, unless a particular passage is cited In case of conflict, the present specification, including definitions, will control. In addition, the materials, methods, and examples are illustrative only and not intended to be limiting.

To the extent not described herein, many details regarding specific materials, processing acts, and circuits are conventional and may be found in textbooks and other sources within the organic light-emitting diode display, photodetector, photovoltaic, and semiconductive member arts.

2. Electrically Conductive Polymers

In one embodiment, the electrically conductive polymer will form a film which has a conductivity of at least $10^{-7}$ S/cm. The monomer from which the conductive polymer is formed, is referred to as a "precursor monomer". A copolymer will have more than one precursor monomer.

In one embodiment, the conductive polymer is made from at least one precursor monomer selected from thiophenes, selenophenes, tellurophenes, pyrroles, anilines, and polycyclic aromatics. The polymers made from these monomers are referred to herein as polythiophenes, poly(selenophenes), poly(tellurophenes), polypyrroles, polyanilines, and polycyclic aromatic polymers, respectively. The term "polycyclic aromatic" refers to compounds having more than one aromatic ring. The rings may be joined by one or more bonds, or they may be fused together. The term "aromatic ring" is intended to include heteroaromatic rings. A "polycyclic heteroaromatic" compound has at least one heteroaromatic ring. In one embodiment, the polycyclic aromatic polymers are poly(thienothiophenes).

In one embodiment, monomers contemplated for use to form the electrically conductive polymer in the new composition comprise Formula I below:

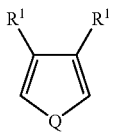

(I)

wherein:

Q is selected from the group consisting of S, Se, and Te;

$R^1$ is independently selected so as to be the same or different at each occurrence and is selected from hydrogen, alkyl, alkenyl, alkoxy, alkanoyl, alkythio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, acrylic acid, phosphoric acid, phosphonic acid, halogen, nitro, cyano, hydroxyl, epoxy, silane, siloxane, alcohol, benzyl, carboxylate, ether, ether carboxylate, amidosulfonate, ether sulfonate, ester sulfonate, and urethane; or both $R^1$ groups together may form an alkylene or alkenylene chain completing a 3, 4, 5, 6, or 7-membered aromatic or alicyclic ring, which ring may optionally include one or more divalent nitrogen, selenium, tellurium, sulfur or oxygen atoms.

As used herein, the term "alkyl" refers to a group derived from an aliphatic hydrocarbon and includes linear, branched and cyclic groups which may be unsubstituted or substituted. The term "heteroalkyl" is intended to mean an alkyl group, wherein one or more of the carbon atoms within the alkyl group has been replaced by another atom, such as nitrogen, oxygen, sulfur, and the like. The term "alkylene" refers to an alkyl group having two points of attachment.

As used herein, the term "alkenyl" refers to a group derived from an aliphatic hydrocarbon having at least one carbon-carbon double bond, and includes linear, branched and cyclic groups which may be unsubstituted or substituted. The term "heteroalkenyl" is intended to mean an alkenyl group, wherein one or more of the carbon atoms within the alkenyl group has been replaced by another atom, such as nitrogen, oxygen, sulfur, and the like. The term "alkenylene" refers to an alkenyl group having two points of attachment.

As used herein, the following terms for substituent groups refer to the formulae given below:

| | |
|---|---|
| "alcohol" | —$R^3$—OH |
| "amido" | —$R^3$—C(O)N($R^6$)$R^6$ |
| "amidosulfonate" | —$R^3$—C(O)N($R^6$)$R^4$—SO$_3$Z |
| "benzyl" | —CH$_2$—C$_6$H$_5$ |
| "carboxylate" | —$R^3$—C(O)O—Z or —$R^3$—O—C(O)—Z |
| "ether" | —$R^3$—(O—$R^5$)$_p$—O—$R^5$ |
| "ether carboxylate" | —$R^3$—O—$R^4$—C(O)O—Z or —$R^3$—O—$R^4$—O—C(O)—Z |
| "ether sulfonate" | —$R^3$—O—$R^4$—SO$_3$Z |
| "ester sulfonate" | —$R^3$—O—C(O)—$R^4$—SO$_3$Z |
| "sulfonimide" | —$R^3$—SO$_2$—NH—SO$_2$—$R^5$ |
| "urethane" | —$R^3$—O—C(O)—N($R^6$)$_2$ | where all "R" groups are the same or different at each occurrence and:

$R^3$ is a single bond or an alkylene group $R^4$ is an alkylene group $R^5$ is an alkyl group $R^6$ is hydrogen or an alkyl group p is 0 or an integer from 1 to 20

Z is H, alkali metal, alkaline earth metal, N($R^5$)$_4$ or $R^5$

Any of the above groups may further be unsubstituted or substituted, and any group may have F substituted for one or more hydrogens, including perfluorinated groups. In one embodiment, the alkyl and alkylene groups have from 1-20 carbon atoms.

In one embodiment, in the monomer, both $R^1$ together form-O—$(CHY)_m$—O—, where m is 2 or 3, and Y is the same or different at each occurrence and is selected from hydrogen, halogen, alkyl, alcohol, amidosulfonate, benzyl, carboxylate, ether, ether carboxylate, ether sulfonate, ester sulfonate, and urethane, where the Y groups may be partially or fully fluorinated. In one embodiment, all Y are hydrogen. In one embodiment, the polymer is poly(3,4-ethylenedioxythiophene). In one embodiment, at least one Y group is not hydrogen. In one embodiment, at least one Y group is a substituent having F substituted for at least one hydrogen. In one embodiment, at least one Y group is perfluorinated.

In one embodiment, the monomer has Formula I(a):

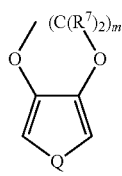

(Ia)

wherein:
Q is selected from the group consisting of S, Se, and Te;
$R^7$ is the same or different at each occurrence and is selected from hydrogen, alkyl, heteroalkyl, alkenyl, heteroalkenyl, alcohol, amidosulfonate, benzyl, carboxylate, ether, ether carboxylate, ether sulfonate, ester sulfonate, and urethane, with the proviso that at least one $R^7$ is not hydrogen, and
m is 2 or 3.

In one embodiment of Formula I(a), m is two, one $R^7$ is an alkyl group of more than 5 carbon atoms, and all other $R^7$ are hydrogen. In one embodiment of Formula I(a), at least one $R^7$ group is fluorinated. In one embodiment, at least one $R^7$ group has at least one fluorine substituent. In one embodiment, the $R^7$ group is fully fluorinated.

In one embodiment of Formula I(a), the $R^7$ substituents on the fused alicyclic ring on the monomer offer improved solubility of the monomers in water and facilitate polymerization in the presence of the fluorinated acid polymer.

In one embodiment of Formula I(a), m is 2, one $R^7$ is sulfonic acid-propylene-ether-methylene and all other $R^7$ are hydrogen. In one embodiment, m is 2, one $R^7$ is propyl-ether-ethylene and all other $R^7$ are hydrogen. In one embodiment, m is 2, one $R^7$ is methoxy and all other $R^7$ are hydrogen. In one embodiment, one $R^7$ is sulfonic acid difluoromethylene ester methylene (—$CH_2$—O—$C(O)$—$CF_2$—$SO_3H$), and all other $R^7$ are hydrogen.

In one embodiment, pyrrole monomers contemplated for use to form the electrically conductive polymer in the new composition comprise Formula II below.

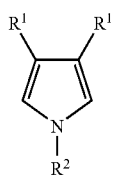

(II)

where in Formula II:
$R^1$ is independently selected so as to be the same or different at each occurrence and is selected from hydrogen, alkyl, alkenyl, alkoxy, alkanoyl, alkythio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, acrylic acid, phosphoric acid, phosphonic acid, halogen, nitro, cyano, hydroxyl, epoxy, silane, siloxane, alcohol, benzyl, carboxylate, ether, amidosulfonate, ether carboxylate, ether sulfonate, ester sulfonate, and urethane; or both $R^1$ groups together may form an alkylene or alkenylene chain completing a 3, 4, 5, 6, or 7-membered aromatic or alicyclic ring, which ring may optionally include one or more divalent nitrogen, sulfur, selenium, tellurium, or oxygen atoms; and $R^2$ is independently selected so as to be the same or different at each occurrence and is selected from hydrogen, alkyl, alkenyl, aryl, alkanoyl, alkylthioalkyl, alkylaryl, arylalkyl, amino, epoxy, silane, siloxane, alcohol, benzyl, carboxylate, ether, ether carboxylate, ether sulfonate, ester sulfonate, and urethane.

In one embodiment, $R^1$ is the same or different at each occurrence and is independently selected from hydrogen, alkyl, alkenyl, alkoxy, cycloalkyl, cycloalkenyl, alcohol, benzyl, carboxylate, ether, amidosulfonate, ether carboxylate, ether sulfonate, ester sulfonate, urethane, epoxy, silane, siloxane, and alkyl substituted with one or more of sulfonic acid, carboxylic acid, acrylic acid, phosphoric acid, phosphonic acid, halogen, nitro, cyano, hydroxyl, epoxy, silane, or siloxane moieties.

In one embodiment, $R^2$ is selected from hydrogen, alkyl, and alkyl substituted with one or more of sulfonic acid, carboxylic acid, acrylic acid, phosphoric acid, phosphonic acid, halogen, cyano, hydroxyl, epoxy, silane, or siloxane moieties.

In one embodiment, the pyrrole monomer is unsubstituted and both $R^1$ and $R^2$ are hydrogen.

In one embodiment, both $R^1$ together form a 6- or 7-membered alicyclic ring, which is further substituted with a group selected from alkyl, heteroalkyl, alcohol, benzyl, carboxylate, ether, ether carboxylate, ether sulfonate, ester sulfonate, and urethane. These groups can improve the solubility of the monomer and the resulting polymer. In one embodiment, both $R^1$ together form a 6- or 7-membered alicyclic ring, which is further substituted with an alkyl group. In one embodiment, both $R^1$ together form a 6- or 7-membered alicyclic ring, which is further substituted with an alkyl group having at least 1 carbon atom.

In one embodiment, both $R^1$ together form —O—$(CHY)_m$—O—, where m is 2 or 3, and Y is the same or different at each occurrence and is selected from hydrogen, alkyl, alcohol, benzyl, carboxylate, amidosulfonate, ether, ether carboxylate, ether sulfonate, ester sulfonate, and urethane. In one embodiment, at least one Y group is not hydrogen. In one embodiment, at least one Y group is a substituent having F substituted for at least one hydrogen. In one embodiment, at least one Y group is perfluorinated.

In one embodiment, aniline monomers contemplated for use to form the electrically conductive polymer in the new composition comprise Formula III below.

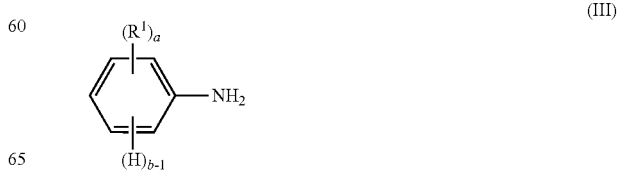

(III)

wherein:

a is 0 or an integer from 1 to 4;

b is an integer from 1 to 5, with the proviso that a+b=5; and $R^1$ is independently selected so as to be the same or different at each occurrence and is selected from hydrogen, alkyl, alkenyl, alkoxy, alkanoyl, alkythio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, acrylic acid, phosphoric acid, phosphonic acid, halogen, nitro, cyano, hydroxyl, epoxy, silane, siloxane, alcohol, benzyl, carboxylate, ether, ether carboxylate, amidosulfonate, ether sulfonate, ester sulfonate, and urethane; or both $R^1$ groups together may form an alkylene or alkenylene chain completing a 3, 4, 5, 6, or 7-membered aromatic or alicyclic ring, which ring may optionally include one or more divalent nitrogen, sulfur or oxygen atoms.

When polymerized, the aniline monomeric unit can have Formula IV(a) or Formula IV(b) shown below, or a combination of both formulae.

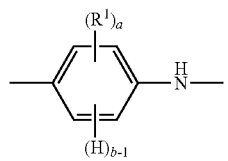

IV(a)

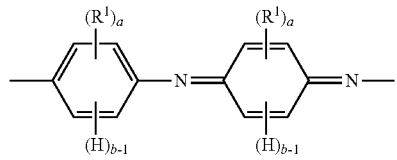

IV(b)

where a, b and $R^1$ are as defined above.

In one embodiment, the aniline monomer is unsubstituted and a=0.

In one embodiment, a is not 0 and at least one $R^1$ is fluorinated. In one embodiment, at least one $R^1$ is perfluorinated.

In one embodiment, fused polycylic heteroaromatic monomers contemplated for use to form the electrically conductive polymer in the new composition have two or more fused aromatic rings, at least one of which is heteroaromatic. In one embodiment, the fused polycyclic heteroaromatic monomer has Formula V:

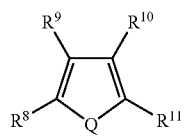

(V)

wherein:

Q is S, Se, Te, or $NR^6$;

$R^6$ is hydrogen or alkyl;

$R^8$, $R^9$, $R^{10}$, and $R^{11}$ are independently selected so as to be the same or different at each occurrence and are selected from hydrogen, alkyl, alkenyl, alkoxy, alkanoyl, alkythio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, acrylic acid, phosphoric acid, phosphonic acid, halogen, nitro, nitrile, cyano, hydroxyl, epoxy, silane, siloxane, alcohol, benzyl, carboxylate, ether, ether carboxylate, amidosulfonate, ether sulfonate, ester sulfonate, and urethane; and at least one of $R^8$ and $R^9$, $R^9$ and $R^{10}$, and $R^{10}$ and $R^{11}$ together form an alkenylene chain completing a 5 or 6-membered aromatic ring, which ring may optionally include one or more divalent nitrogen, sulfur, selenium, tellurium, or oxygen atoms.

In one embodiment, the fused polycyclic heteroaromatic monomer has Formula V(a), V(b), V(c), V(d), V(e), V(f), and V(g):

(Va)

(Vb)

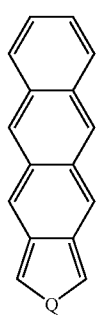

(Vc)

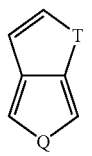

(Vd)

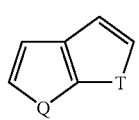

(Ve)

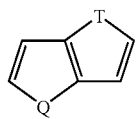

(Vf)

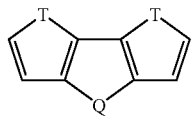

(Vg)

wherein:
Q is S, Se, Te, or NH; and
T is the same or different at each occurrence and is selected from S, $NR^6$, O, $SiR^6_2$, Se, Te, and $PR^6$;
$R^6$ is hydrogen or alkyl.

The fused polycyclic heteroaromatic monomers may be further substituted with groups selected from alkyl, heteroalkyl, alcohol, benzyl, carboxylate, ether, ether carboxylate, ether sulfonate, ester sulfonate, and urethane. In one embodiment, the substituent groups are fluorinated. In one embodiment, the substituent groups are fully fluorinated.

In one embodiment, the fused polycyclic heteroaromatic monomer is a thieno(thiophene). Such compounds have been discussed in, for example, Macromolecules, 34, 5746-5747 (2001); and Macromolecules, 35, 7281-7286 (2002). In one embodiment, the thieno(thiophene) is selected from thieno(2,3-b)thiophene, thieno(3,2-b)thiophene, and thieno(3,4-b)thiophene. In one embodiment, the thieno(thiophene) monomer is further substituted with at least one group selected from alkyl, heteroalkyl, alcohol, benzyl, carboxylate, ether, ether carboxylate, ether sulfonate, ester sulfonate, and urethane. In one embodiment, the substituent groups are fluorinated. In one embodiment, the substituent groups are fully fluorinated.

In one embodiment, polycyclic heteroaromatic monomers contemplated for use to form the polymer in the new composition comprise Formula VI:

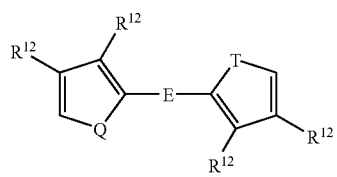

(VI)

wherein:
Q is S, Se, Te, or $NR^6$;
T is selected from S, $NR^6$, O, $SiR^6_2$, Se, Te, and $PR^6$;
E is selected from alkenylene, arylene, and heteroarylene;
$R^6$ is hydrogen or alkyl;
$R^{12}$ is the same or different at each occurrence and is selected from hydrogen, alkyl, alkenyl, alkoxy, alkanoyl, alkythio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, acrylic acid, phosphoric acid, phosphonic acid, halogen, nitro, nitrile, cyano, hydroxyl, epoxy, silane, siloxane, alcohol, benzyl, carboxylate, ether, ether carboxylate, amidosulfonate, ether sulfonate, ester sulfonate, and urethane; or both $R^{12}$ groups together may form an alkylene or alkenylene chain completing a 3, 4, 5, 6, or 7-membered aromatic or alicyclic ring, which ring may optionally include one or more divalent nitrogen, sulfur, selenium, tellurium, or oxygen atoms.

In one embodiment, the electrically conductive polymer is a copolymer of a precursor monomer and at least one second monomer. Any type of second monomer can be used, so long as it does not detrimentally affect the desired properties of the copolymer. In one embodiment, the second monomer comprises no more than 50% of the polymer, based on the total number of monomer units. In one embodiment, the second monomer comprises no more than 30%, based on the total number of monomer units. In one embodiment, the second monomer comprises no more than 10%, based on the total number of monomer units.

Exemplary types of second monomers include, but are not limited to, alkenyl, alkynyl, arylene, and heteroarylene. Examples of second monomers include, but are not limited to, fluorene, oxadiazole, thiadiazole, benzothiadiazole, phenylenevinylene, phenyleneethynylene, pyridine, diazines, and triazines, all of which may be further substituted.

In one embodiment, the copolymers are made by first forming an intermediate precursor monomer having the structure A-B-C, where A and C represent precursor monomers, which can be the same or different, and B represents a second monomer. The A-B-C intermediate precursor monomer can be prepared using standard synthetic organic techniques, such as Yamamoto, Stille, Grignard metathesis, Suzuki, and Negishi couplings. The copolymer is then formed by oxidative polymerization of the intermediate precursor monomer alone, or with one or more additional precursor monomers.

In one embodiment, the electrically conductive polymer is a copolymer of two or more precursor monomers. In one embodiment, the precursor monomers are selected from a thiophene, a selenophene, a tellurophene, a pyrrole, an aniline, and a polycyclic aromatic.

3. Fluorinated Acid Polymers

The fluorinated acid polymer can be any polymer which is fluorinated and has acidic groups with acidic protons. The term includes partially and fully fluorinated materials. In one embodiment, the fluorinated acid polymer is highly fluorinated. The term "highly fluorinated" means that at least 50% of the available hydrogens bonded to a carbon, have been replaced with fluorine. The acidic groups supply an ionizable proton. In one embodiment, the acidic proton has a pKa of less than 3. In one embodiment, the acidic proton has a pKa of less than 0. In one embodiment, the acidic proton has a pKa of less than −5. The acidic group can be attached directly to the polymer backbone, or it can be attached to side chains on the polymer backbone. Examples of acidic groups include, but are not limited to, carboxylic acid groups, sulfonic acid groups, sulfonimide groups, phosphoric acid groups, phosphonic acid groups, and combinations thereof. The acidic groups can all be the same, or the polymer may have more than one type of acidic group.

In one embodiment, the fluorinated acid polymer is water-soluble. In one embodiment, the fluorinated acid polymer is dispersible in water.

In one embodiment, the fluorinated acid polymer is organic solvent wettable. The term "organic solvent wettable" refers to a material which, when formed into a film, is wettable by organic solvents. In one embodiment, wettable materials form films which are wettable by phenylhexane with a contact angle no greater than 40°. As used herein, the term "contact angle" is intended to mean the angle φ shown in FIG. 1. For a droplet of liquid medium, angle φ is defined by the intersection of the plane of the surface and a line from the outer edge of the droplet to the surface. Furthermore, angle φ is measured after the droplet has reached an equilibrium position on the surface after being applied, i.e. "static contact angle". The film of the organic solvent wettable fluorinated polymeric acid is represented as the surface. In one embodiment, the contact angle is no greater than 35°. In one embodiment, the contact angle is no greater than 30°. The methods for measuring contact angles are well known.

In one embodiment, the polymer backbone is fluorinated. Examples of suitable polymeric backbones include, but are not limited to, polyolefins, polyacrylates, polymethacrylates, polyimides, polyamides, polyaramids, polyacrylamides, polystyrenes, and copolymers thereof. In one embodiment, the polymer backbone is highly fluorinated. In one embodiment, the polymer backbone is fully fluorinated.

In one embodiment, the acidic groups are sulfonic acid groups or sulfonimide groups. A sulfonimide group has the formula:

where R is an alkyl group.

In one embodiment, the acidic groups are on a fluorinated side chain. In one embodiment, the fluorinated side chains are selected from alkyl groups, alkoxy groups, amido groups, ether groups, and combinations thereof.

In one embodiment, the fluorinated acid polymer has a fluorinated olefin backbone, with pendant fluorinated ether sulfonate, fluorinated ester sulfonate, or fluorinated ether sulfonimide groups. In one embodiment, the polymer is a copolymer of 1,1-difluoroethylene and 2-(1,1-difluoro-2-(trifluoromethyl)allyloxy)-1,1,2,2-tetrafluoroethanesulfonic acid. In one embodiment, the polymer is a copolymer of ethylene and 2-(2-(1,2,2-trifluorovinyloxy)-1,1,2,3,3,3-hexafluoropropoxy)-1,1,2,2-tetrafluoroethanesulfonic acid. These copolymers can be made as the corresponding sulfonyl fluoride polymer and then can be converted to the sulfonic acid form.

In one embodiment, the fluorinated acid polymer is homopolymer or copolymer of a fluorinated and partially sulfonated poly(arylene ether sulfone). The copolymer can be a block copolymer. Examples of comonomers include, but are not limited to butadiene, butylene, isobutylene, styrene, and combinations thereof.

In one embodiment, the fluorinated acid polymer is a homopolymer or copolymer of monomers having Formula VII:

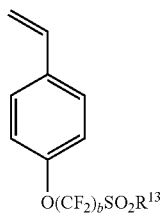

(VII)

where:
b is an integer from 1 to 5,
$R^{13}$ is OH or $NHR^{14}$, and
$R^{14}$ is alkyl, fluoroalkyl, sulfonylalkyl, or sulfonylfluoroalkyl.

In one embodiment, the monomer is "SFS" or "SFSI" shown below:

SFS

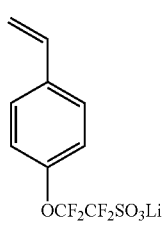

SFSI

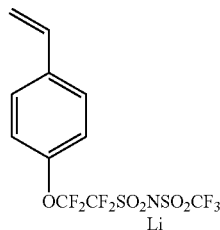

After polymerization, the polymer can be converted to the acid form.

In one embodiment, the fluorinated acid polymer is a homopolymer or copolymer of a trifluorostyrene having acidic groups. In one embodiment, the trifluorostyrene monomer has Formula VIII:

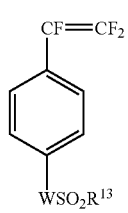

(VIII)

where:
W is selected from $(CF_2)_b$, $O(CF_2)_b$, $S(CF_2)_b$, $(CF_2)_bO(CF_2)_b$,
b is independently an integer from 1 to 5,
$R^{13}$ is OH or $NHR^{14}$, and
$R^{14}$ is alkyl, fluoroalkyl, sulfonylalkyl, or sulfonylfluoroalkyl.

In one embodiment, the fluorinated acid polymer is a sulfonimide polymer having Formula IX:

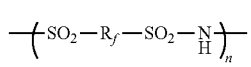

(IX)

where:
$R_f$ is selected from fluorinated alkylene, fluorinated heteroalkylene, fluorinated arylene, and fluorinated heteroarylene; and
n is at least 4.

In one embodiment of Formula IX, $R_f$ is a perfluoroalkyl group. In one embodiment, $R_f$ is a perfluorobutyl group. In one embodiment, $R_f$ contains ether oxygens. In one embodiment n is greater than 10.

In one embodiment, the fluorinated acid polymer comprises a fluorinated polymer backbone and a side chain having Formula X:

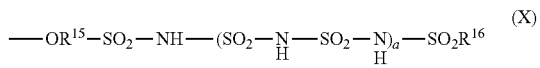

(X)

where:
$R^{15}$ is a fluorinated alkylene group or a fluorinated heteroalkylene group;
$R^{16}$ is a fluorinated alkyl or a fluorinated aryl group; and
a is 0 or an integer from 1 to 4.

In one embodiment, the fluorinated acid polymer has Formula XI:

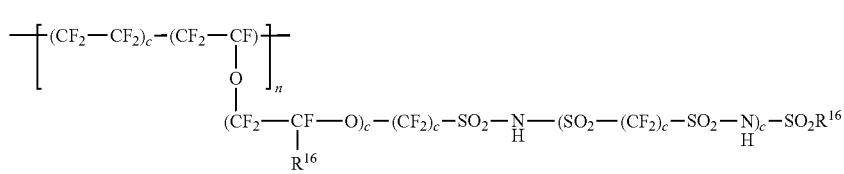

(XI)

where:

$R^{16}$ is a fluorinated alkyl or a fluorinated aryl group;

c is independently 0 or an integer from 1 to 3; and n is at least 4.

The synthesis of fluorinated acid polymers has been described in, for example, A. Feiring et al., J. Fluorine Chemistry 2000, 105, 129-135; A. Feiring et al., Macromolecules 2000, 33, 9262-9271; D. D. Desmarteau, J. Fluorine Chem. 1995, 72, 203-208; A. J. Appleby et al., J. Electrochem. Soc. 1993, 140(1), 109-111; and Desmarteau, U.S. Pat. No. 5,463,005.

In one embodiment, the fluorinated acid polymer comprises at least one repeat unit derived from an ethylenically unsaturated compound having the structure (XII):

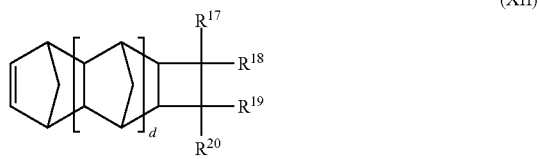

(XII)

wherein n is 0, 1, or 2;

$R^{17}$ to $R^{20}$ are independently H, halogen, alkyl or alkoxy of 1 to 10 carbon atoms, Y, $C(R_f')(R_f')OR^{21}$, $R^4Y$ or $OR^4Y$;

Y is $COE^2$, $SO_2E^2$, or sulfonimide;

$R^{21}$ is hydrogen or an acid-labile protecting group;

$R_f'$ is the same or different at each occurrence and is a fluoroalkyl group of 1 to 10 carbon atoms, or taken together are $(CF_2)_e$ where e is 2 to 10;

$R^4$ is an alkylene group;

$E^2$ is OH, halogen, or $OR^5$; and $R^5$ is an alkyl group;

with the proviso that at least one of $R^{17}$ to $R^{20}$ is Y, $R^4Y$ or $OR^5Y$. $R^4$, $R^5$, and $R^{17}$ to $R^{20}$ may optionally be substituted by halogen or ether oxygen.

Some illustrative, but nonlimiting, examples of representative monomers of structure (XII) and within the scope of the invention are presented below (XII-a-XII-e, left to right):

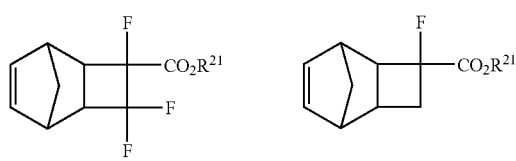

-continued

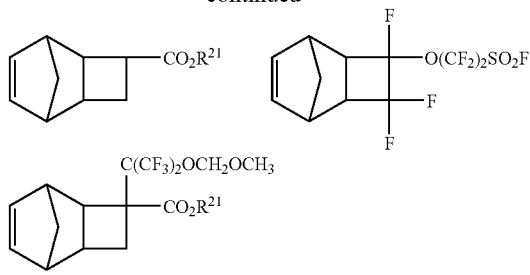

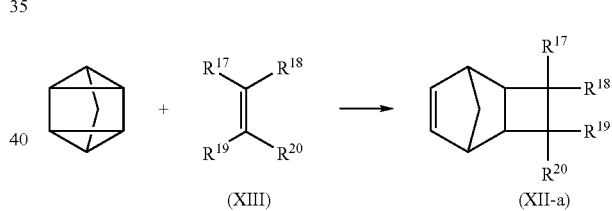

wherein $R^{21}$ is a group capable of forming or rearranging to a tertiary cation, more typically an alkyl group of 1 to 20 carbon atoms, and most typically t-butyl.

Compounds of structure (XII) wherein d=0, structures (XII-a-XII-e), may be prepared by cycloaddition reaction of unsaturated compounds of structure (XIII) with quadricyclane (tetracyclo[2.2.1.0$^{2,6}$0$^{3,5}$]heptane) as shown in the equation below.

The Reaction May be Conducted at Temperatures Ranging from about 0° C. to about 200° C., more typically from about 30° C. to about 150° C. in the absence or presence of an inert solvent such as diethyl ether. For reactions conducted at or above the boiling point of one or more of the reagents or solvent, a closed reactor is typically used to avoid loss of volatile components. Compounds of structure (XII) with higher values of d (i.e., d=1 or 2) may be prepared by reaction of compounds of structure (XII) with d=0 with cyclopentadiene, as is known in the art.

In one embodiment, the fluorinated acid polymer also comprises a repeat unit derived from at least one ethylenically unsaturated compound containing at least one fluorine atom attached to an ethylenically unsaturated carbon. The fluoroolefin comprises 2 to 20 carbon atoms. Representative fluoroolefins include, but are not limited to, tetrafluoroethylene, hexafluoropropylene, chlorotrifluoroethylene, vinylidene fluoride, vinyl fluoride, perfluoro-(2,2-dimethyl-1,3-dioxole), perfluoro-(2-methylene-4-methyl-1,3-dioxolane), $CF_2=CFO(CF_2)_tCF=CF_2$, where t is 1 or 2, and $R_f''OCF=CF_2$ wherein $R_f''$ is a saturated fluoroalkyl group of from 1 to about ten carbon atoms. In one embodiment, the comonomer is tetrafluoroethylene.

In one embodiment, the fluorinated acid polymer comprises a polymeric backbone having pendant groups comprising siloxane sulfonic acid. In one embodiment, the siloxane pendant groups have the formula below:

$$—O_aSi(OH)_{b-a}R^{22}_{3-b}R^{23}R_fSO_3H$$

wherein:

a is from 1 to b;

b is from 1 to 3;

$R^{22}$ is a non-hydrolyzable group independently selected from the group consisting of alkyl, aryl, and arylalkyl;

$R^{23}$ is a bidentate alkylene radical, which may be substituted by one or more ether oxygen atoms, with the proviso that $R^{23}$ has at least two carbon atoms linearly disposed between Si and $R_f$; and $R_f$ is a perfluoralkylene radical, which may be substituted by one or more ether oxygen atoms.

In one embodiment, the fluorinated acid polymer having pendant siloxane groups has a fluorinated backbone. In one embodiment, the backbone is perfluorinated.

In one embodiment, the fluorinated acid polymer has a fluorinated backbone and pendant groups represented by the Formula (XIV)

$$—O_g—[CF(R_f^2)CF—O_h]_i—CF_2CF_2SO_3H \quad (XIV)$$

wherein $R_f^2$ is F or a perfluoroalkyl radical having 1-10 carbon atoms either unsubstituted or substituted by one or more ether oxygen atoms, h=0 or 1, i=0 to 3, and g=0 or 1.

In one embodiment, the fluorinated acid polymer has formula (XV)

$$—(CF_2CF_2)_j(CH_2CQ^1_2)_k(CQ^2_2CQ^2)— \atop \quad | \atop O_g—[CF(R_f^2)CF_2—O_h]_i—CF_2CF_2SO_3H \quad (XV)$$

where j≧0, k≧0 and 4≦(j+k)≦199, $Q^1$ and $Q^2$ are F or H, $R_f^2$ is F or a perfluoroalkyl radical having 1-10 carbon atoms either unsubstituted or substituted by one or more ether oxygen atoms, h=0 or 1, i=0 to 3, g=0 or 1. In one embodiment $R_f^2$ is —CF$_3$, g=1, h=1, and i=1. In one embodiment the pendant group is present at a concentration of 3-10 mol-%.

In one embodiment, $Q^1$ is H, k≧0, and $Q^2$ is F, which may be synthesized according to the teachings of Connolly et al., U.S. Pat. No. 3,282,875. In another preferred embodiment, $Q^1$ is H, $Q^2$ is H, g=0, $R_f^2$ is F, h=1, and I=1, which may be synthesized according to the teachings of co-pending application Ser. No. 60/105,662. Still other embodiments may be synthesized according to the various teachings in Drysdale et al., WO 9831716(A1), and co-pending US applications Choi et al, WO 99/52954(A1), and 60/176,881.

In one embodiment, the fluorinated acid polymer is a colloid-forming polymeric acid. As used herein, the term "colloid-forming" refers to materials which are insoluble in water, and form colloids when dispersed into an aqueous medium. The colloid-forming polymeric acids typically have a molecular weight in the range of about 10,000 to about 4,000,000.

In one embodiment, the polymeric acids have a molecular weight of about 100,000 to about 2,000,000. Colloid particle size typically ranges from 2 nanometers (nm) to about 140 nm. In one embodiment, the colloids have a particle size of 2 nm to about 30 nm. Any colloid-forming polymeric material having acidic protons can be used. In one embodiment, the colloid-forming fluorinated polymeric acid has acidic groups selected from carboxylic groups, sulfonic acid groups, and sulfonimide groups. In one embodiment, the colloid-forming fluorinated polymeric acid is a polymeric sulfonic acid. In one embodiment, the colloid-forming polymeric sulfonic acid is perfluorinated. In one embodiment, the colloid-forming polymeric sulfonic acid is a perfluoroalkylenesulfonic acid.

In one embodiment, the colloid-forming polymeric acid is a highly-fluorinated sulfonic acid polymer ("FSA polymer"). "Highly fluorinated" means that at least about 50% of the total number of halogen and hydrogen atoms in the polymer are fluorine atoms, an in one embodiment at least about 75%, and in another embodiment at least about 90%. In one embodiment, the polymer is perfluorinated. The term "sulfonate functional group" refers to either to sulfonic acid groups or salts of sulfonic acid groups, and in one embodiment alkali metal or ammonium salts. The functional group is represented by the formula —SO$_3$E$^5$ where E$^5$ is a cation, also known as a "counterion". E$^5$ may be H, Li, Na, K or N(R$_1$)(R$_2$)(R$_3$)(R$_4$), and R$_1$, R$_2$, R$_3$, and R$_4$ are the same or different and are and in one embodiment H, CH$_3$ or C$_2$H$_5$. In another embodiment, E$^5$ is H, in which case the polymer is said to be in the "acid form". E$^5$ may also be multivalent, as represented by such ions as Ca$^{++}$, and Al$^{+++}$. It is clear to the skilled artisan that in the case of multivalent counterions, represented generally as M$^{x+}$, the number of sulfonate functional groups per counterion will be equal to the valence "x".

In one embodiment, the FSA polymer comprises a polymer backbone with recurring side chains attached to the backbone, the side chains carrying cation exchange groups. Polymers include homopolymers or copolymers of two or more monomers. Copolymers are typically formed from a non-functional monomer and a second monomer carrying the cation exchange group or its precursor, e.g., a sulfonyl fluoride group (—SO$_2$F), which can be subsequently hydrolyzed to a sulfonate functional group. For example, copolymers of a first fluorinated vinyl monomer together with a second fluorinated vinyl monomer having a sulfonyl fluoride group (—SO$_2$F) can be used. Possible first monomers include tetrafluoroethylene (TFE), hexafluoropropylene, vinyl fluoride, vinylidine fluoride, trifluoroethylene, chlorotrifluoroethylene, perfluoro(alkyl vinyl ether), and combinations thereof. TFE is a preferred first monomer.

In other embodiments, possible second monomers include fluorinated vinyl ethers with sulfonate functional groups or precursor groups which can provide the desired side chain in the polymer. Additional monomers, including ethylene, propylene, and R—CH=CH$_2$ where R is a perfluorinated alkyl group of 1 to 10 carbon atoms, can be incorporated into these polymers if desired. The polymers may be of the type referred to herein as random copolymers, that is copolymers made by polymerization in which the relative concentrations of the comonomers are kept as constant as possible, so that the distribution of the monomer units along the polymer chain is in accordance with their relative concentrations and relative reactivities. Less random copolymers, made by varying relative concentrations of monomers in the course of the polymerization, may also be used. Polymers of the type called block copolymers, such as that disclosed in European Patent Application No. 1 026 152 A1, may also be used.

In one embodiment, FSA polymers for use in the present invention include a highly fluorinated, and in one embodiment perfluorinated, carbon backbone and side chains represented by the formula $$—(O—CF_2CFR_f^3)_a—O—CF_2CFR_f^4SO_3E^5$$

wherein $R_f^3$ and $R_f^4$ are independently selected from F, Cl or a perfluorinated alkyl group having 1 to 10 carbon atoms, a=0, 1 or 2, and $E^5$ is H, Li, Na, K or $N(R_1)(R_2)(R_3)(R_4)$ and $R_1$, $R_2$, $R_3$, and $R_4$ are the same or different and are and in one embodiment H, $CH_3$ or $C_2H_5$. In another embodiment $E^5$ is H. As stated above, $E^5$ may also be multivalent.

In one embodiment, the FSA polymers include, for example, polymers disclosed in U.S. Pat. No. 3,282,875 and in U.S. Pat. Nos. 4,358,545 and 4,940,525. An example of preferred FSA polymer comprises a perfluorocarbon backbone and the side chain represented by the formula

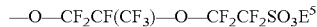

where X is as defined above. FSA polymers of this type are disclosed in U.S. Pat. No. 3,282,875 and can be made by copolymerization of tetrafluoroethylene (TFE) and the perfluorinated vinyl ether $CF_2\!=\!CF\!-\!O\!-\!CF_2CF(CF_3)\!-\!O\!-\!CF_2CF_2SO_2F$, perfluoro(3,6-dioxa-4-methyl-7-octenesulfonyl fluoride) (PDMOF), followed by conversion to sulfonate groups by hydrolysis of the sulfonyl fluoride groups and ion exchanged as necessary to convert them to the desired ionic form. An example of a polymer of the type disclosed in U.S. Pat. Nos. 4,358,545 and 4,940,525 has the side chain $-\!O\!-\!CF_2CF_2SO_3E^5$, wherein $E^5$ is as defined above. This polymer can be made by copolymerization of tetrafluoroethylene (TFE) and the perfluorinated vinyl ether $CF_2\!=\!CF\!-\!O\!-\!CF_2CF_2SO_2F$, perfluoro(3-oxa-4-pentenesulfonyl fluoride) (POPF), followed by hydrolysis and further ion exchange as necessary.

In one embodiment, the FSA polymers for use in this invention typically have an ion exchange ratio of less than about 33. In this application, "ion exchange ratio" or "IXR" is defined as number of carbon atoms in the polymer backbone in relation to the cation exchange groups. Within the range of less than about 33, IXR can be varied as desired for the particular application. In one embodiment, the IXR is about 3 to about 33, and in another embodiment about 8 to about 23.

The cation exchange capacity of a polymer is often expressed in terms of equivalent weight (EW). For the purposes of this application, equivalent weight (EW) is defined to be the weight of the polymer in acid form required to neutralize one equivalent of sodium hydroxide. In the case of a sulfonate polymer where the polymer has a perfluorocarbon backbone and the side chain is $-\!O\!-\!CF_2\!-\!CF(CF_3)\!-\!O\!-\!CF_2\!-\!CF_2\!-\!SO_3H$ (or a salt thereof), the equivalent weight range which corresponds to an IXR of about 8 to about 23 is about 750 EW to about 1500 EW. IXR for this polymer can be related to equivalent weight using the formula: 50 IXR+344=EW. While the same IXR range is used for sulfonate polymers disclosed in U.S. Pat. Nos. 4,358,545 and 4,940,525, e.g., the polymer having the side chain $-\!O\!-\!CF_2CF_2SO_3H$ (or a salt thereof), the equivalent weight is somewhat lower because of the lower molecular weight of the monomer unit containing a cation exchange group. For the preferred IXR range of about 8 to about 23, the corresponding equivalent weight range is about 575 EW to about 1325 EW. IXR for this polymer can be related to equivalent weight using the formula: 50 IXR+178=EW.

The FSA polymers can be prepared as colloidal aqueous dispersions. They may also be in the form of dispersions in other media, examples of which include, but are not limited to, alcohol, water-soluble ethers, such as tetrahydrofuran, mixtures of water-soluble ethers, and combinations thereof. In making the dispersions, the polymer can be used in acid form. U.S. Pat. Nos. 4,433,082, 6,150,426 and WO 03/006537 disclose methods for making of aqueous alcoholic dispersions. After the dispersion is made, concentration and the dispersing liquid composition can be adjusted by methods known in the art.

Aqueous dispersions of the colloid-forming polymeric acids, including FSA polymers, typically have particle sizes as small as possible and an EW as small as possible, so long as a stable colloid is formed.

Aqueous dispersions of FSA polymer are available commercially as Nafion® dispersions, from E. I. du Pont de Nemours and Company (Wilmington, Del.).

Some of the polymers described hereinabove may be formed in non-acid form, e.g., as salts, esters, or sulfonyl fluorides. They will be converted to the acid form for the preparation of conductive compositions, described below.

4. Preparation of Conductive Polymer Compositions

The conductive polymer composition comprising a conductive polymer doped with the fluorinated acid polymer is prepared by polymerizing the precursor monomers in the presence of the fluorinated acid polymer. The conductive polymer composition comprising a conductive polymer in admixture with a fluorinated acid polymer is prepared by first forming the intrinsically conductive copolymer and combining it with the fluorinated acid polymer.

a. Conductive Polymer Dosed with a Fluorinated Acid Polymer

In one embodiment, the electrically conductive polymer composition is formed by the oxidative polymerization of the precursor monomers in the presence of the fluorinated acid polymer. In one embodiment, the precursor monomers comprises two or more conductive precursor monomers. In one embodiment, the monomers comprise an intermediate precursor monomer having the structure A-B-C, where A and C represent conductive precursor monomers, which can be the same or different, and B represents a non-conductive precursor monomer. In one embodiment, the intermediate precursor monomer is polymerized with one or more conductive precursor monomers.

In one embodiment, the oxidative polymerization is carried out in a homogeneous aqueous solution. In another embodiment, the oxidative polymerization is carried out in an emulsion of water and an organic solvent. In general, some water is present in order to obtain adequate solubility of the oxidizing agent and/or catalyst. Oxidizing agents such as ammonium persulfate, sodium persulfate, potassium persulfate, and the like, can be used. A catalyst, such as ferric chloride, or ferric sulfate may also be present. The resulting polymerized product will be a solution, dispersion, or emulsion of the conductive polymer in association with the fluorinated acid polymer. In one embodiment, the intrinsically conductive polymer is positively charged, and the charges are balanced by the fluorinated acid polymer anion.

In one embodiment, the method of making an aqueous dispersion of the new conductive polymer composition includes forming a reaction mixture by combining water, precursor monomer, at least one fluorinated acid polymer, and an oxidizing agent, in any order, provided that at least a portion of the fluorinated acid polymer is present when at least one of the precursor monomer and the oxidizing agent is added.

In one embodiment, the method of making the new conductive polymer composition comprises:
(a) providing an aqueous solution or dispersion of a fluorinated acid polymer;
(b) adding an oxidizer to the solutions or dispersion of step (a); and
(c) adding precursor monomer to the mixture of step (b).

In another embodiment, the precursor monomer is added to the aqueous solution or dispersion of the fluorinated acid polymer prior to adding the oxidizer. Step (b) above, which is adding oxidizing agent, is then carried out.

In another embodiment, a mixture of water and the precursor monomer is formed, in a concentration typically in the range of about 0.5% by weight to about 4.0% by weight total precursor monomer. This precursor monomer mixture is added to the aqueous solution or dispersion of the fluorinated acid polymer, and steps (b) above which is adding oxidizing agent is carried out.

In another embodiment, the aqueous polymerization mixture may include a polymerization catalyst, such as ferric sulfate, ferric chloride, and the like. The catalyst is added before the last step. In another embodiment, a catalyst is added together with an oxidizing agent.

In one embodiment, the polymerization is carried out in the presence of co-dispersing liquids which are miscible with water. Examples of suitable co-dispersing liquids include, but are not limited to ethers, alcohols, alcohol ethers, cyclic ethers, ketones, nitriles, sulfoxides, amides, and combinations thereof. In one embodiment, the co-dispersing liquid is an alcohol. In one embodiment, the co-dispersing liquid is an organic solvent selected from n-propanol, isopropanol, t-butanol, dimethylacetamide, dimethylformamide, N-methylpyrrolidone, and mixtures thereof. In general, the amount of co-dispersing liquid should be less than about 60% by volume. In one embodiment, the amount of co-dispersing liquid is less than about 30% by volume. In one embodiment, the amount of co-dispersing liquid is between 5 and 50% by volume. The use of a co-dispersing liquid in the polymerization significantly reduces particle size and improves filterability of the dispersions. In addition, buffer materials obtained by this process show an increased viscosity and films prepared from these dispersions are of high quality.

The co-dispersing liquid can be added to the reaction mixture at any point in the process.

In one embodiment, the polymerization is carried out in the presence of a co-acid which is a Brønsted acid. The acid can be an inorganic acid, such as HCl, sulfuric acid, and the like, or an organic acid, such as acetic acid or p-toluenesulfonic acid. Alternatively, the acid can be a water soluble polymeric acid such as poly(styrenesulfonic acid), poly(2-acrylamido-2-methyl-1-propanesulfonic acid, or the like, or a second fluorinated acid polymer, as described above. Combinations of acids can be used.

The co-acid can be added to the reaction mixture at any point in the process prior to the addition of either the oxidizer or the precursor monomer, whichever is added last. In one embodiment, the co-acid is added before both the precursor monomers and the fluorinated acid polymer, and the oxidizer is added last. In one embodiment the co-acid is added prior to the addition of the precursor monomers, followed by the addition of the fluorinated acid polymer, and the oxidizer is added last.

In one embodiment, the polymerization is carried out in the presence of both a co-dispersing liquid and a co-acid.

In one embodiment, a reaction vessel is charged first with a mixture of water, alcohol co-dispersing agent, and inorganic co-acid. To this is added, in order, the precursor monomers, an aqueous solution or dispersion of fluorinated acid polymer, and an oxidizer. The oxidizer is added slowly and dropwise to prevent the formation of localized areas of high ion concentration which can destabilize the mixture. The mixture is stirred and the reaction is then allowed to proceed at a controlled temperature. When polymerization is completed, the reaction mixture is treated with a strong acid cation resin, stirred and filtered; and then treated with a base anion exchange resin, stirred and filtered. Alternative orders of addition can be used, as discussed above.

In the method of making the new conductive polymer composition, the molar ratio of oxidizer to total precursor monomer is generally in the range of 0.1 to 2.0; and in one embodiment is 0.4 to 1.5. The molar ratio of fluorinated acid polymer to total precursor monomer is generally in the range of 0.2 to 5. In one embodiment, the ratio is in the range of 1 to 4. The overall solid content is generally in the range of about 1.0% to 10% in weight percentage; and in one embodiment of about 2% to 4.5%. The reaction temperature is generally in the range of about 4° C. to 50° C.; in one embodiment about 20° C. to 35° C. The molar ratio of optional co-acid to precursor monomer is about 0.05 to 4. The addition time of the oxidizer influences particle size and viscosity. Thus, the particle size can be reduced by slowing down the addition speed. In parallel, the viscosity is increased by slowing down the addition speed. The reaction time is generally in the range of about 1 to about 30 hours.

b. Conductive Polymer in Admixture with a Fluorinated Acid Polymer

In one embodiment, the intrinsically conductive polymers are formed separately from the fluorinated acid polymer. In one embodiment, the polymers are prepared by oxidatively polymerizing the corresponding monomers in aqueous solution. In one embodiment, the oxidative polymerization is carried out in the presence of a water soluble acid. In one embodiment, the acid is a water-soluble non-fluororinated polymeric acid. In one embodiment, the acid is a non-fluorinated polymeric sulfonic acid. Some non-limiting examples of the acids are poly(styrenesulfonic acid) ("PSSA"), poly(2-acrylamido-2-methyl-1-propanesulfonic acid) ("PAAMPSA"), and mixtures thereof. Where the oxidative polymerization results in a polymer that has positive charge, the acid anion provides the counterion for the conductive polymer. The oxidative polymerization is carried out using an oxidizing agent such as ammonium persulfate, sodium persulfate, and mixtures thereof.

The new electrically conductive polymer composition is prepared by blending the intrinsically conductive polymer with the fluorinated acid polymer. This can be accomplished by adding an aqueous dispersion of the intrinsically conductive polymer to a dispersion or solution of the polymeric acid. In one embodiment, the composition is further treated using sonication or microfluidization to ensure mixing of the components.

In one embodiment, one or both of the intrinsically conductive polymer and fluorinated acid polymer are isolated in solid form. The solid material can be redispersed in water or in an aqueous solution or dispersion of the other component. For example, intrinsically conductive polymer solids can be dispersed in an aqueous solution or dispersion of a fluorinated acid polymer.

c. pH Adjustment

As synthesized, the aqueous dispersions of the new conductive polymer composition generally have a very low pH. In one embodiment, the pH is adjusted to higher values, without adversely affecting the properties in devices. In one embodiment, the pH of the dispersion is adjusted to about 1.5 to about 4. In one embodiment, the pH is adjusted to between 3 and 4. It has been found that the pH can be adjusted using known techniques, for example, ion exchange or by titration with an aqueous basic solution.

In one embodiment, after completion of the polymerization reaction, the as-synthesized aqueous dispersion is contacted with at least one ion exchange resin under conditions suitable to remove decomposed species, side reaction products, and unreacted monomers, and to adjust pH, thus producing a stable, aqueous dispersion with a desired pH. In one embodiment, the as-synthesized aqueous dispersion is contacted with a first ion exchange resin and a second ion exchange resin, in any order. The as-synthesized aqueous dispersion can be treated with both the first and second ion exchange resins simultaneously, or it can be treated sequentially with one and then the other.

Ion exchange is a reversible chemical reaction wherein an ion in a fluid medium (such as an aqueous dispersion) is exchanged for a similarly charged ion attached to an immobile solid particle that is insoluble in the fluid medium. The term "ion exchange resin" is used herein to refer to all such substances. The resin is rendered insoluble due to the crosslinked nature of the polymeric support to which the ion exchanging groups are attached. Ion exchange resins are classified as cation exchangers or anion exchangers. Cation exchangers have positively charged mobile ions available for exchange, typically protons or metal ions such as sodium ions. Anion exchangers have exchangeable ions which are negatively charged, typically hydroxide ions.

In one embodiment, the first ion exchange resin is a cation, acid exchange resin which can be in protonic or metal ion, typically sodium ion, form. The second ion exchange resin is a basic, anion exchange resin. Both acidic, cation including proton exchange resins and basic, anion exchange resins are contemplated for use in the practice of the invention. In one embodiment, the acidic, cation exchange resin is an inorganic acid, cation exchange resin, such as a sulfonic acid cation exchange resin. Sulfonic acid cation exchange resins contemplated for use in the practice of the invention include, for example, sulfonated styrene-divinylbenzene copolymers, sulfonated crosslinked styrene polymers, phenol-formaldehyde-sulfonic acid resins, benzene-formaldehyde-sulfonic acid resins, and mixtures thereof. In another embodiment, the acidic, cation exchange resin is an organic acid, cation exchange resin, such as carboxylic acid, acrylic or phosphorous cation exchange resin. In addition, mixtures of different cation exchange resins can be used.

In another embodiment, the basic, anionic exchange resin is a tertiary amine anion exchange resin. Tertiary amine anion exchange resins contemplated for use in the practice of the invention include, for example, tertiary-aminated styrene-divinylbenzene copolymers, tertiary-aminated crosslinked styrene polymers, tertiary-aminated phenol-formaldehyde resins, tertiary-aminated benzene-formaldehyde resins, and mixtures thereof. In a further embodiment, the basic, anionic exchange resin is a quaternary amine anion exchange resin, or mixtures of these and other exchange resins.

The first and second ion exchange resins may contact the as-synthesized aqueous dispersion either simultaneously, or consecutively. For example, in one embodiment both resins are added simultaneously to an as-synthesized aqueous dispersion of an electrically conducting polymer, and allowed to remain in contact with the dispersion for at least about 1 hour, e.g., about 2 hours to about 20 hours. The ion exchange resins can then be removed from the dispersion by filtration. The size of the filter is chosen so that the relatively large ion exchange resin particles will be removed while the smaller dispersion particles will pass through. Without wishing to be bound by theory, it is believed that the ion exchange resins quench polymerization and effectively remove ionic and non-ionic impurities and most of unreacted monomer from the as-synthesized aqueous dispersion. Moreover, the basic, anion exchange and/or acidic, cation exchange resins renders the acidic sites more basic, resulting in increased pH of the dispersion. In general, about one to five grams of ion exchange resin is used per gram of new conductive polymer composition.

In many cases, the basic ion exchange resin can be used to adjust the pH to the desired level. In some cases, the pH can be further adjusted with an aqueous basic solution such as a solution of sodium hydroxide, ammonium hydroxide, tetramethylammonium hydroxide, or the like.

In another embodiment, more conductive dispersions are formed by the addition of highly conductive additives to the aqueous dispersions of the new conductive polymer composition. Because dispersions with relatively high pH can be formed, the conductive additives, especially metal additives, are not attacked by the acid in the dispersion. Examples of suitable conductive additives include, but are not limited to metal particles and nanoparticles, nanowires, carbon nanotubes, graphite fibers or particles, carbon particles, and combinations thereof.

4. Removal of Dissolved Oxygen

The aqueous dispersion of the conductive polymer composition is then treated to remove dissolved oxygen from the aqueous liquid medium.

In one embodiment, membrane-based degasification is used. This process uses a microporous hydrophobic membrane with a very small pore size. In one embodiment, the pore size is less than 0.1 µm. In one embodiment, the pore size is between 0.01 and 0.05 µm. In one embodiment, the pore size is about 0.03 µm. The aqueous dispersion is passed on one side of the membrane and an atmosphere, a vacuum, or a separate phase is applied to the other side to remove the dissolved oxygen. Because of the difference in the gas concentration or pressure between the two sides, the dissolved oxygen will move from the aqueous medium, through the pores to the other side of the membrane. In one embodiment, a vacuum is applied. Since the membrane comprises a hydrophobic material and the pores are small, the aqueous dispersion does not easily pass through the pores. Gases, and, in particular, oxygen, can freely pass through the pores on a molecular level and be removed. Such membranes have been discussed in, for example, U.S. Pat. Nos. 5,876,604, 5,902,747, and 6,921,482.

Figure 2:
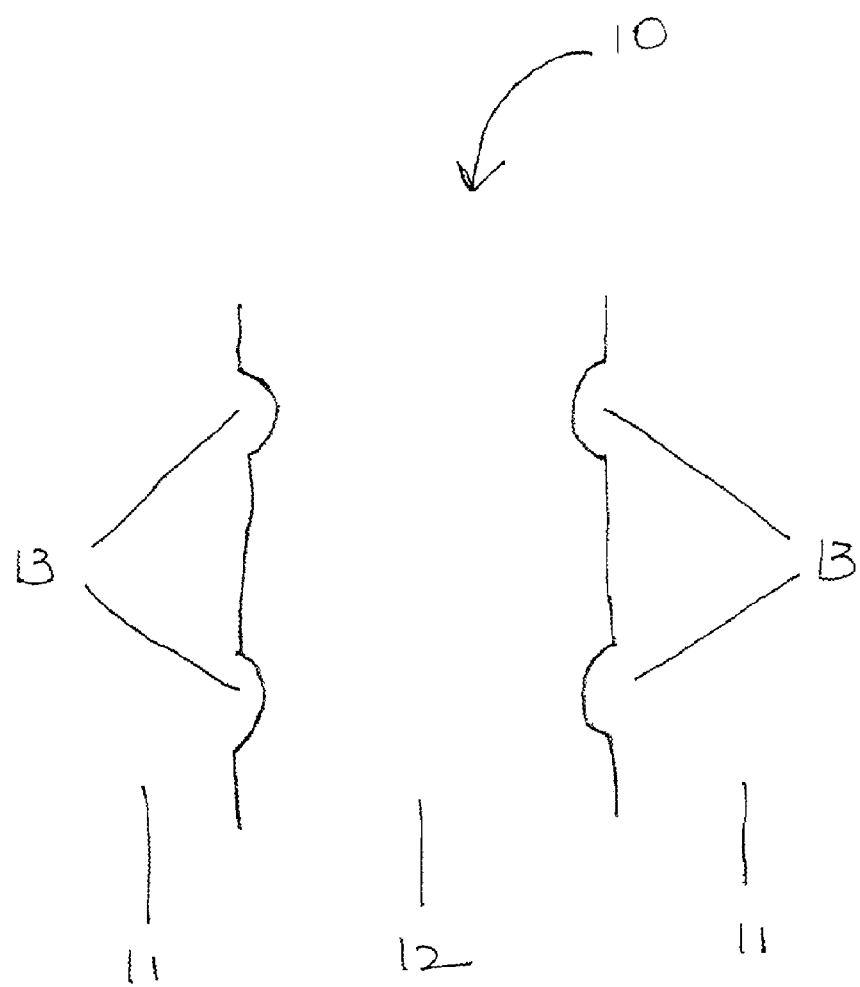
FIG. 2 is a diagram illustrating a hollow fiber membrane filter.
Figure 3:
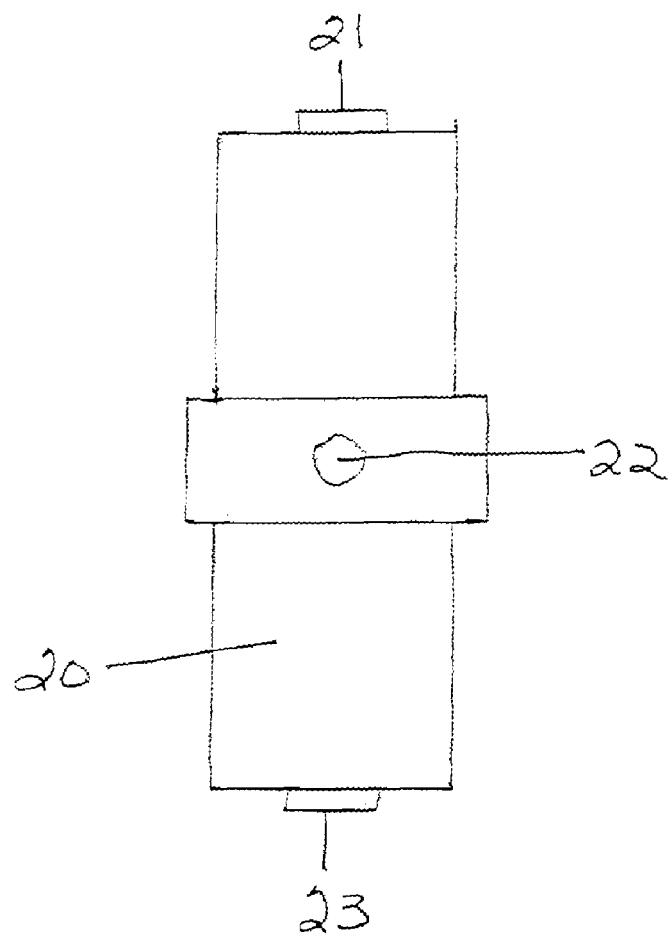
FIG. 3 is a schematic diagram of hollow fiber membrane filter in a housing.

In one embodiment, a hollow fiber membrane is used for degasification. The hollow fiber membrane is a tubular filament having a porous wall. In one embodiment, as shown in FIG. 2, the aqueous dispersion flows on the outside, 11, of hollow fiber 10. A vacuum and/or sweep gas is applied to the inside, 12, of the fiber. The oxygen dissolved in the aqueous medium of the dispersion moves through the pores, 13, and is removed. The hollow fiber membrane is generally contained in a housing, as shown in FIG. 3. The housing, 20, has a liquid inlet, 21, a liquid outlet, 22, and a vacuum port, 23. Hollow fiber membrane cartridges are commercially available from, for example, Membrana (Charlotte, N.C.).

In one embodiment, the aqueous dispersion of conductive polymer composition is passed through a hollow fiber membrane using vacuum to remove the oxygen. The level of vacuum and flow rate will depend on the actual equipment used. In some embodiments, a vacuum less than 100 torr is used. In some embodiments, the vacuum is less than 50 torr; in some embodiments less than 10 torr; in some embodiments, less than 1 torr. In one embodiment, the flow rate is between 10 and 50 ml/min. In some embodiments, the aqueous dispersion is passed through a hollow fiber membrane two or more times. In some embodiments, the aqueous dispersion is passed through two or more hollow fiber membranes in series.

In another embodiment, the dissolved oxygen in the aqueous dispersion liquid medium is removed by substitution with inert gas. Gases such as nitrogen, argon, and helium are commonly used. These gases can simply be bubbled through the aqueous dispersion. In one embodiment, helium is used. The time required will depend on the amount of aqueous dispersion and gas flow rate.

In another embodiment, the dissolved oxygen is removed by the addition of chemical reductants. Ammonium sulfite is one example of a reductant that can be used, resulting in the formation of sulfate ions. Depending upon the ultimate end use for the conductive polymer composition, the additional byproduct ions may or may not be acceptable.

In another embodiment, the dissolved oxygen is removed by freeze-pump-thaw cycling. The aqueous dispersion is placed in a flask and flash-frozen, usually with liquid nitrogen. Next, a vacuum is applied, and the flask is sealed. The sealed flask is warmed to thaw the fluid. This can be accomplished using a warm water bath. Upon thawing, bubbles of oxygen gas form and are removed by the vacuum. In some embodiments the process is repeated two or more times.

In one embodiment, the degasified aqueous dispersion has an oxygen level less than 10% of the saturated level. In most cases, saturated water has an oxygen content of about 8.5 ppm. In one embodiment, the degasified aqueous dispersion has an oxygen level less than 0.5 ppm; in one embodiment, less than 0.1 ppm.

After degasification, the aqueous dispersion of conductive polymer composition is stored in such a way as to prevent oxygen reabsorption. In one embodiment, the aqueous dispersion is stored under a blanket of an inert gas. In one embodiment, the gas is nitrogen. In one embodiment, the aqueous dispersion is stored in a sealed glass container to minimize oxygen permeation. In one embodiment, an oxygen scavenger is present in the container. The oxygen scavenger reacts with any oxygen that remains in or is added into the container. In one embodiment, the oxygen scavenger is in the form of a polymeric film. The film can be a lining of the container walls, a cap liner, a sheet insert, or any combination thereof. Oxygen scavenging film compositions have been disclosed in, for example, U.S. Pat. No. 6,872,451.

6. Organic Electronic Device

Examples of organic electronic device include, but are not limited to: (1) a device that converts electrical energy into radiation (e.g., a light-emitting diode, light emitting diode display, diode laser, or lighting panel), (2) a device that detects a signal using an electronic process (e.g., a photodetector, a photoconductive cell, a photoresistor, a photoswitch, a phototransistor, a phototube, an infrared ("IR") detector, or a biosensors), (3) a device that converts radiation into electrical energy (e.g., a photovoltaic device or solar cell), (4) a device that includes one or more electronic components that include one or more organic semiconductor layers (e.g., a transistor or diode), or any combination of devices in items (1) through (4).

The conductive polymer compositions described herein can be used to form any of the conductive or semiconductive layers in such electronic devices.

Organic light-emitting diodes ("OLEDs") are an organic electronic device comprising an organic layer capable of electroluminescence. OLEDs containing conducting polymers can have the following configuration:

anode/buffer layer/EL material/cathode

The anode is typically any material that is transparent and has the ability to inject holes into the EL material, such as, for example, indium/tin oxide (ITO). The anode is optionally supported on a glass or plastic substrate. EL materials include fluorescent compounds, fluorescent and phosphorescent metal complexes, conjugated polymers, and mixtures thereof. The cathode is typically any material (such as, e.g., Ca or Ba) that has the ability to inject electrons into the EL material. the conductive polymer compositions described herein can be used to form the buffer layer in OLEDs.

Electrically conducting polymers which have the ability to carry a high current when subjected to a low electrical voltage, also have utility as electrodes for electronic devices, such as thin film field effect transistors. In such transistors, an organic semiconducting film which has high mobility for electron and/or hole charge carriers, is present between source and drain electrodes. A gate electrode is on the opposite side of the semiconducting polymer layer. To be useful for the electrode application, the electrically conducting polymers and the liquids for dispersing or dissolving the electrically conducting polymers have to be compatible with the semiconducting polymers and the solvents for the semiconducting polymers to avoid re-dissolution of either conducting polymers or semiconducting polymers.

EXAMPLES

The concepts described herein will be further described in the following examples, which do not limit the scope of the invention described in the claims.

Example 1

Note that not all of the activities described above in the general description or the examples are required, that a portion of a specific activity may not be required, and that one or more further activities may be performed in addition to those described. Still further, the order in which activities are listed are not necessarily the order in which they are performed.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The use of numerical values in the various ranges specified herein is stated as approximations as though the minimum and maximum values within the stated ranges were both being preceded by the word "about." In this manner slight variations above and below the stated ranges can be used to achieve substantially the same results as values within the ranges. Also, the disclosure of these ranges is intended as a continuous range including every value between the minimum and maximum average values including fractional values that can result when some of components of one value are mixed with those of different value. Moreover, when broader and narrower ranges are disclosed, it is within the contemplation of this invention to match a minimum value from one range with a maximum value from another range and vice versa.

It is to be appreciated that certain features are, for clarity, described herein in the context of separate embodiments, may also be provided in combination in a single embodiment. Conversely, various features that are, for brevity, described in the context of a single embodiment, may also be provided separately or in any subcombination

What is claimed is:

1. An article comprising a container and an electrically conductive polymer composition dispersed in an aqueous liquid medium located in the container, wherein the composition has a dissolved oxygen content maintained at less than 0.5 ppm of the dispersion, wherein the electrically conductive polymer composition is selected from the group consisting of an electrically conductive polymer doped with a fluorinated acid polymer, an electrically conductive polymer in admixture with a fluorinated acid polymer, and mixtures thereof, and, wherein the electrically conductive polymer is made from at least one precursor monomer selected from pyrroles and at least one second monomer selected from the group consisting of pyrroles which are the same or different than the first monomer, alkenyl monomer, alkynyl monomer, arylene, and heteroarylene.

2. The article of claim 1, wherein the oxygen content is less than 0.1 ppm.

3. The article of claim 1, wherein the conductive polymer composition has a conductivity that changes by less than 10% in 30 days.

4. The article of claim 1 wherein the second monomer comprises no more than 50% of the polymer, based on the total number of monomer units.

5. The article of claim 1, wherein the fluorinated acid polymer is highly fluorinated.

6. The article of claim 1, wherein the fluorinated acid polymer is water-soluble.

7. The article of claim 6, wherein the fluorinated acid polymer is colloid-forming and is a highly-fluorinated sulfonic acid polymer or salt thereof.

8. The article of claim 1, wherein the fluorinated acid polymer is dispersible in water.

9. The article of claim 1, wherein the fluorinated acid polymer is colloid-forming and is a highly-fluorinated sulfonic acid polymer or salt thereof.

10. The article of claim 1 wherein the second monomer is one or more pyrroles.

11. A method for producing an article comprising a container and a conductive polymer composition dispersed in an aqueous liquid medium, said process comprising:
    polymerizing a conductive monomer in the presence of a fluorinated acid polymer to form a doped conductive polymer;
    removing oxygen dissolved in the aqueous medium;
    adding the conductive polymer composition to a container and maintaining the dissolved oxygen content at less than 0.5 ppm of the dispersion.

12. The method of claim 11, wherein the polymerization comprises:
    (a) providing an aqueous solution or dispersion of a fluorinated acid polymer;
    (b) adding an oxidizer to the solution or dispersion of step (a); and
    (c) adding precursor monomer to the mixture of step (b).

13. The method of claim 11, wherein the polymerization comprises:
    (a) providing an aqueous solution or dispersion of a fluorinated acid polymer;
    (b) adding precursor monomer to the solution or dispersion of step (a); and
    (c) adding an oxidizer to the mixture of step (b).

14. The method of claim 11, wherein dissolved oxygen is removed from the aqueous medium by membrane-based degasification.

* * * * *